United States Patent
Jansson et al.

(10) Patent No.: US 11,946,399 B2
(45) Date of Patent: Apr. 2, 2024

(54) TEMPERATURE SENSING UNIT AND UREA SENSOR

(71) Applicant: TE Connectivity Norge AS, Blomsterdalen (NO)

(72) Inventors: Niklas Jansson, Blomsterdalen (NO); Bjornar Berge Lie, Blomsterdalen (NO); Harald Aadland, Blomsterdalen (NO); Oyvind Rortveit, Blomsterdalen (NO)

(73) Assignee: TE Connectivity Norge AS, Blomsterdalen (NO)

( * ) Notice: Subject to any disclaimer, the term of this patent is extended or adjusted under 35 U.S.C. 154(b) by 517 days.

(21) Appl. No.: 17/136,196

(22) Filed: Dec. 29, 2020

(65) Prior Publication Data

US 2021/0115833 A1  Apr. 22, 2021

Related U.S. Application Data

(63) Continuation of application No. PCT/EP2019/068818, filed on Jul. 12, 2019.

(30) Foreign Application Priority Data

Jul. 12, 2018  (DE) .......................... 202018104014.6

(51) Int. Cl.
*G01K 13/00* (2021.01)
*F01N 3/20* (2006.01)
(Continued)

(52) U.S. Cl.
CPC .......... *F01N 11/002* (2013.01); *F01N 3/2066* (2013.01); *G01K 13/00* (2013.01);
(Continued)

(58) Field of Classification Search
CPC ........ G01K 3/00; G01K 1/20; G01K 2205/00; F01N 1/002; F01N 3/2066; F01N 560/14;
(Continued)

(56) References Cited

U.S. PATENT DOCUMENTS 4,423,629 A * 1/1984 Ara ........................ G01F 23/248
374/54
6,615,658 B2 * 9/2003 Snelling ................ G01F 23/247
340/622

(Continued)

FOREIGN PATENT DOCUMENTS

CN  113811748 A * 12/2001 ............... G01K 1/08
CN  100446978 C * 12/2008 .......... B41J 2/14209
(Continued)

OTHER PUBLICATIONS

17136196_2023-09-14_CN_100446978_C_H.pdf,Dec. 2008.*
(Continued)

*Primary Examiner* — Gail Kaplan Verbitsky
(74) *Attorney, Agent, or Firm* — Barley Snyder

(57) ABSTRACT

A temperature sensing unit includes a temperature sensor and a substrate including a first region and a second region. The temperature sensor is arranged in the second region. The second region extends away from the first region.

11 Claims, 5 Drawing Sheets

(51) Int. Cl.
*F01N 11/00* (2006.01)
*H05K 1/02* (2006.01)
*H05K 1/03* (2006.01)
*H05K 1/14* (2006.01)

(52) U.S. Cl.
CPC ...... *F01N 2560/06* (2013.01); *F01N 2560/14* (2013.01); *F01N 2610/02* (2013.01); *F01N 2610/1406* (2013.01); *F01N 2610/148* (2013.01); *G01K 2205/00* (2013.01); *H05K 1/028* (2013.01); *H05K 1/03* (2013.01); *H05K 1/14* (2013.01); *H05K 1/147* (2013.01); *H05K 2201/10151* (2013.01)

(58) Field of Classification Search
CPC .......... F01N 2610/10; F01N 2610/148; F01N 2610/02; F01N 2560/06; F01N 2610/1406; H05K 1/03; H05K 1/14; H05K 1/147; H05K 2201/10151; H05K 1/028
See application file for complete search history.

(56) References Cited

U.S. PATENT DOCUMENTS

| | | | |
|---|---|---|---|
| 6,880,970 B2 | 4/2005 | Mirov | |
| 7,465,088 B2* | 12/2008 | Garcia | G01K 1/14 374/208 |
| 7,500,780 B2* | 3/2009 | Miki | H05K 1/09 374/185 |
| 7,726,876 B2* | 6/2010 | Laverdiere | G01J 5/02 374/208 |
| 8,109,670 B2* | 2/2012 | Al-Misfer | G05D 9/12 374/54 |
| 8,425,114 B2* | 4/2013 | Hori | G01K 13/02 374/185 |
| 2001/0035827 A1* | 11/2001 | Snelling | G01F 23/248 340/622 |
| 2006/0052969 A1* | 3/2006 | Hunt | G01K 1/18 374/E1.022 |
| 2007/0150225 A1* | 6/2007 | Boerstler | G01K 7/01 702/132 |
| 2010/0162690 A1 | 7/2010 | Hosaka et al. | |
| 2011/0051776 A1* | 3/2011 | Bieberich | G01K 13/20 600/549 |
| 2015/0003491 A1 | 1/2015 | Matsumoto | |
| 2015/0276509 A1* | 10/2015 | Carbone | G01K 7/42 374/110 |

FOREIGN PATENT DOCUMENTS

| | | | | |
|---|---|---|---|---|
| CN | 102892989 B | * | 10/2016 | ............... F01N 11/00 |
| DE | 10312077 B3 | * | 8/2004 | ........... B60H 1/0075 |
| DE | 10312077 B3 | | 8/2004 | |
| EP | 1669743 A1 | * | 6/2006 | ............... F01N 11/00 |
| EP | 1669743 A1 | | 6/2006 | |
| EP | 3372969 A1 | * | 9/2018 | ............... G01K 1/14 |
| JP | H0989680 A | * | 4/1997 | |
| KR | 100714648 B1 | * | 5/2007 | |
| WO | 2012081773 A1 | | 6/2012 | |
| WO | WO-2020187370 A1 | * | 9/2020 | ............... G01K 1/08 |

OTHER PUBLICATIONS

17136196_2023-09-14_CN_100446978_C_I.pdf,Dec. 2008.*
17136196_2023-09-14_KR_100714648_B1_H.pdf,May 2007.*
17136196_2023-11-27_CN_113811748_A_H.pdf,Dec. 2021.*
International Search Report, International Application No. PCT/EP2019/068818, dated Sep. 9, 2019.

* cited by examiner

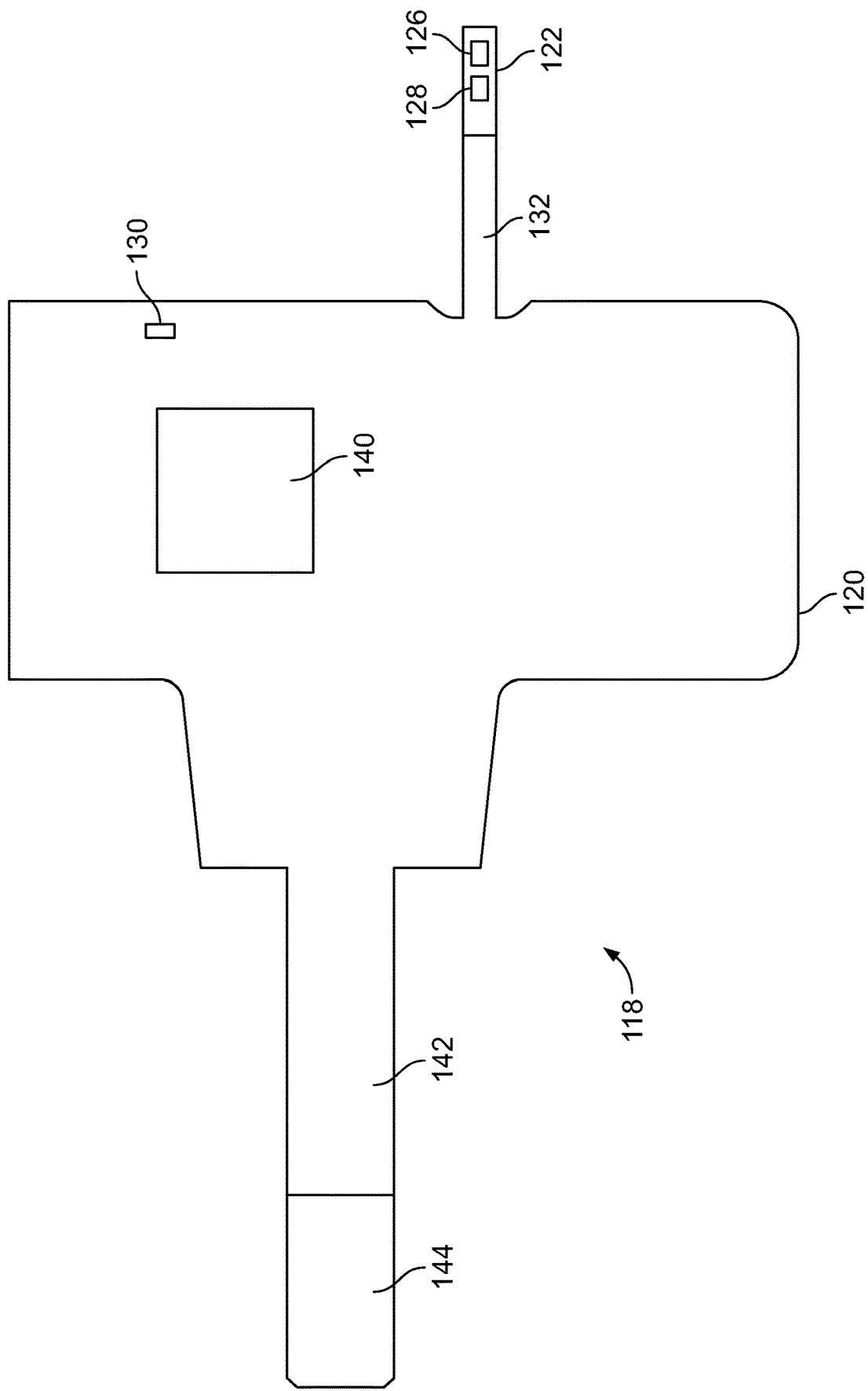

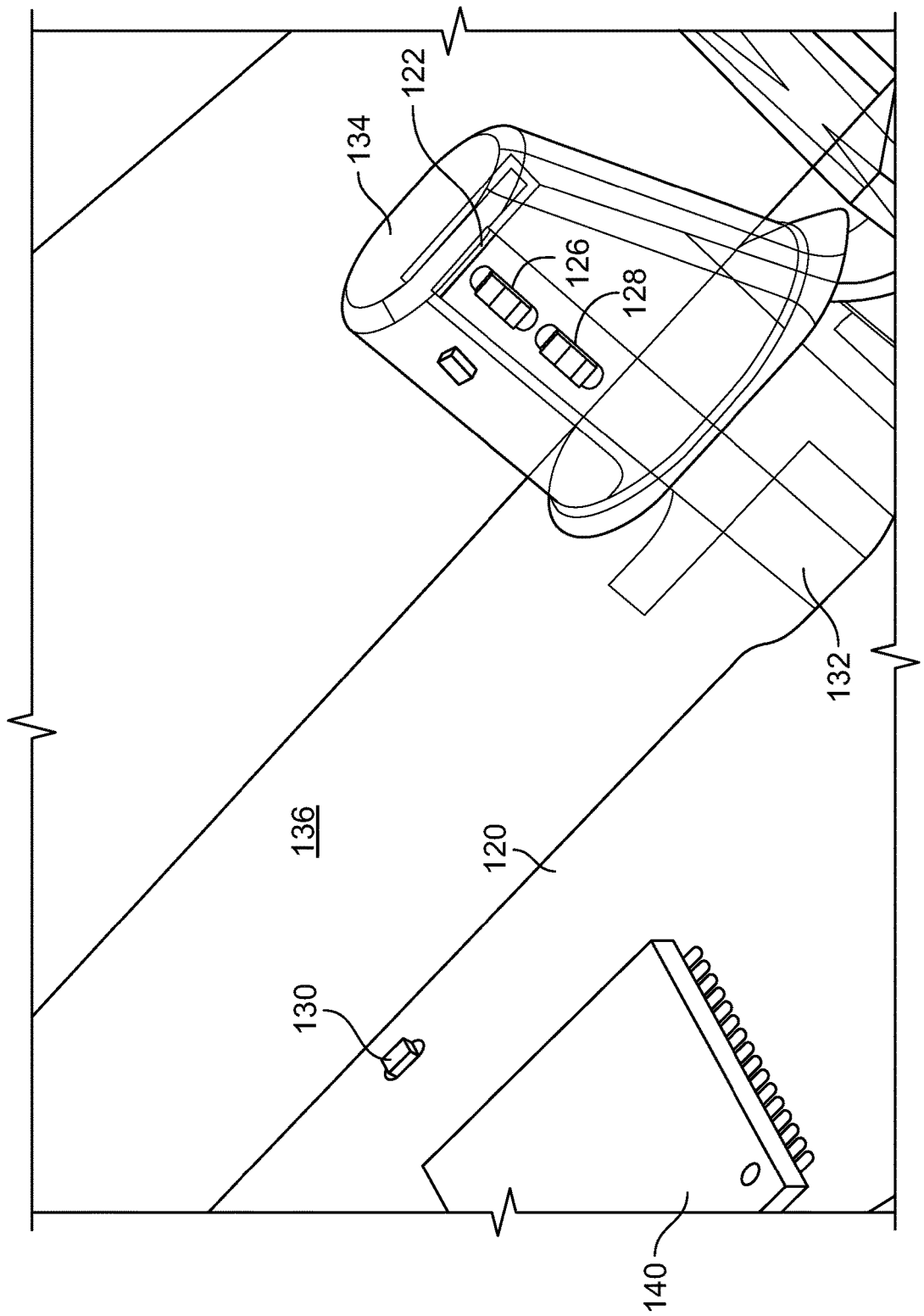

TEMPERATURE SENSING UNIT AND UREA SENSOR

CROSS-REFERENCE TO RELATED APPLICATIONS

This application is a continuation of PCT International Application No. PCT/EP2019/068818, filed on Jul. 12, 2019, which claims priority under 35 U.S.C. § 119 to German Patent Application No. 202018104014.6, filed on Jul. 12, 2018.

FIELD OF THE INVENTION

The present invention relates to a temperature sensing unit and, more particularly, to a temperature sensing unit that is usable with urea sensors.

BACKGROUND

Selective Catalytic Reduction (SCR) reduction systems have been employed for purification of harmful NOx components in the exhaust gases of diesel vehicles. The SCR systems use urea solution referred to as Diesel Exhaust Fluid (DEF) for purification of the exhaust gases. The urea solution is stored in a urea tank provided on the vehicles. It is essential to ensure appropriate composition and levels of the urea solution inside the tank to achieve efficient purification of the exhaust gases. Urea sensors are thus employed in the urea tanks for measurement of the level and/or concentration and/or temperature of the urea solution in the tank.

A urea sensor is provided with a level measurement device. In addition, a concentration and/or quality measurement device, temperature measurement device, a suction tube and a return tube are provided. The suction tube draws urea solution from the urea tank and provides it for breaking down the NOx in the exhaust gas and the return tube circulates any excess amount of urea solution back into the urea tank.

A precise temperature measurement is required because the temperature value is needed to calculate the concentration of DEF, for instance based on the speed of sound in the liquid. In order to achieve a high accuracy of the concentration measurement, the temperature in the liquid must be known accurately. Moreover, since the urea solution has a freezing point of −11° C. there is risk of freezing of the urea solution for any temperature below −11° C. Frozen urea solution can pose problems and difficulty in achieving efficient breaking down of NOx. This is because of high volume expansion of the urea solution due to freezing which can result in excessive pressure generated inside the suction tube. Consequently, it is important to precisely monitor the temperature of the urea solution in the tank.

Existing temperature sensors are arranged in close proximity to a heater or are located on the same printed circuit board (PCB) as the remainder of the electronic components. Due to the heating of these electronic components, the temperature sensor is affected and its accuracy is reduced. Moreover, existing assembly concepts of temperature sensors exhibit often an unsatisfactory thermal coupling between the fluid and the temperature sensor through the potting material that covers the PCB with the temperature sensor. On the other hand, temperature sensing units that are provided as separate components being connected to the PCB for instance via a plug connector are expensive and require additional assembly steps when mounting the temperature sensing unit. There is still a need for a temperature sensor arrangement that yields highly accurate measurement results and can be fabricated economically, at the same time being robust even in challenging application environments.

SUMMARY

A temperature sensing unit includes a temperature sensor and a substrate including a first region and a second region. The temperature sensor is arranged in the second region. The second region extends away from the first region.

BRIEF DESCRIPTION OF THE DRAWINGS

The invention will now be described by way of example with reference to the accompanying Figures, of which:

FIG. 4 is a plan view of a substrate of the sensor part;

FIG. 5 is a perspective view of the sensor part; and

DETAILED DESCRIPTION OF THE EMBODIMENT(S)

The accompanying drawings are incorporated into the specification and form a part of the specification to illustrate several embodiments of the present invention. These drawings, together with the description, serve to explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements.

Figure 1:
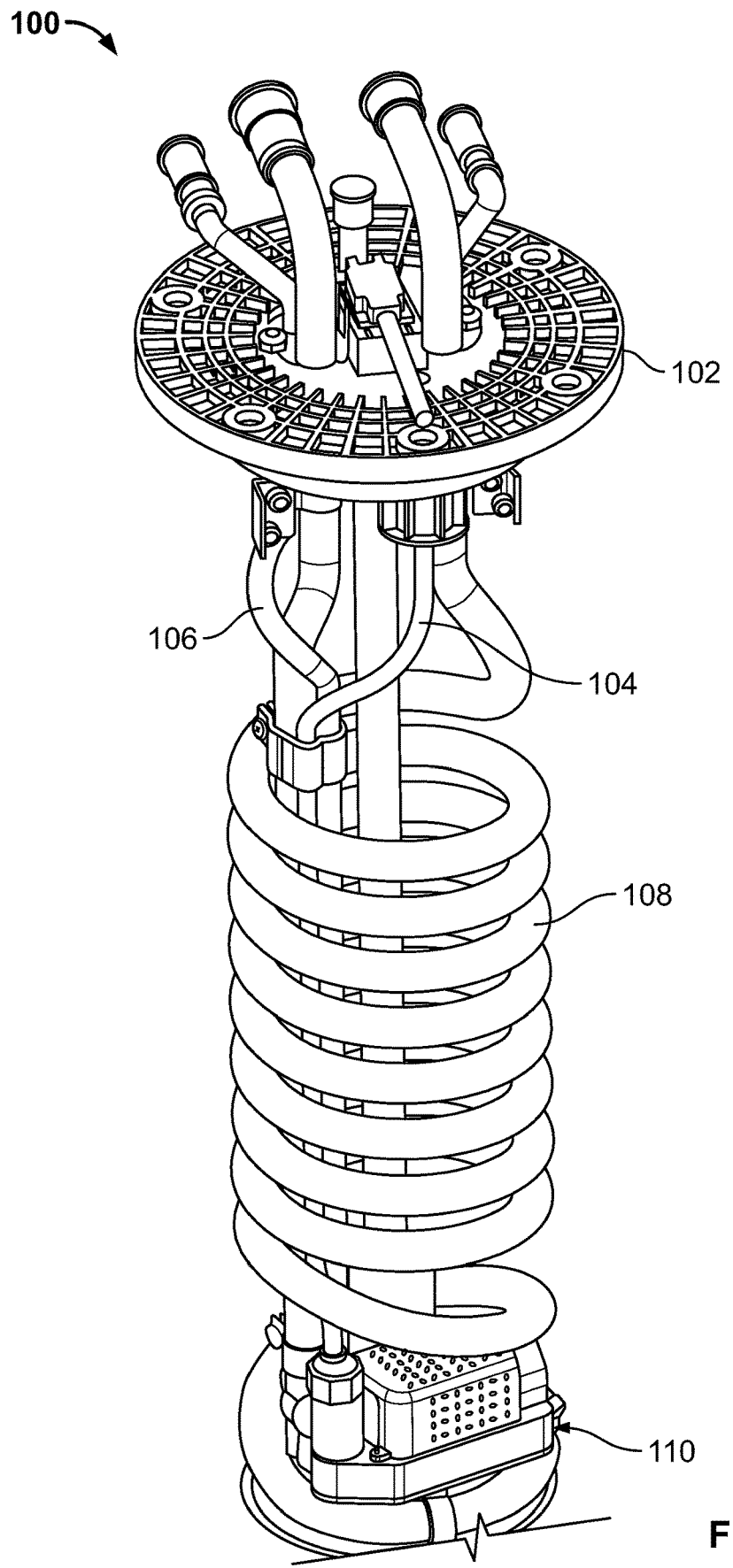
FIG. 1 is a perspective view of a urea sensor module according to an embodiment.

A urea sensor module 100 according to an embodiment is shown in FIG. 1. The urea sensor module 100 has a base plate 102 which is to be mounted in an orifice of a urea tank belonging to a selective catalytic reduction (SCR) system. A urea suction pipe 104 and a urea return pipe 106 are provided for the transport of urea solution. A heating pipeline 108 is provided for heating up the urea solution if necessary.

At the distal end of the urea sensor module 100, opposing to the base plate 102, a sensor part 110 is arranged as shown in FIG. 1. The sensor part 110, in an embodiment, includes a temperature sensing unit according to the principles of the present invention, but also a urea solution quality sensor for instance based on an ultrasonic principle, and an electronic control unit (ECU) for driving and evaluating the sensor components.

Figure 2:
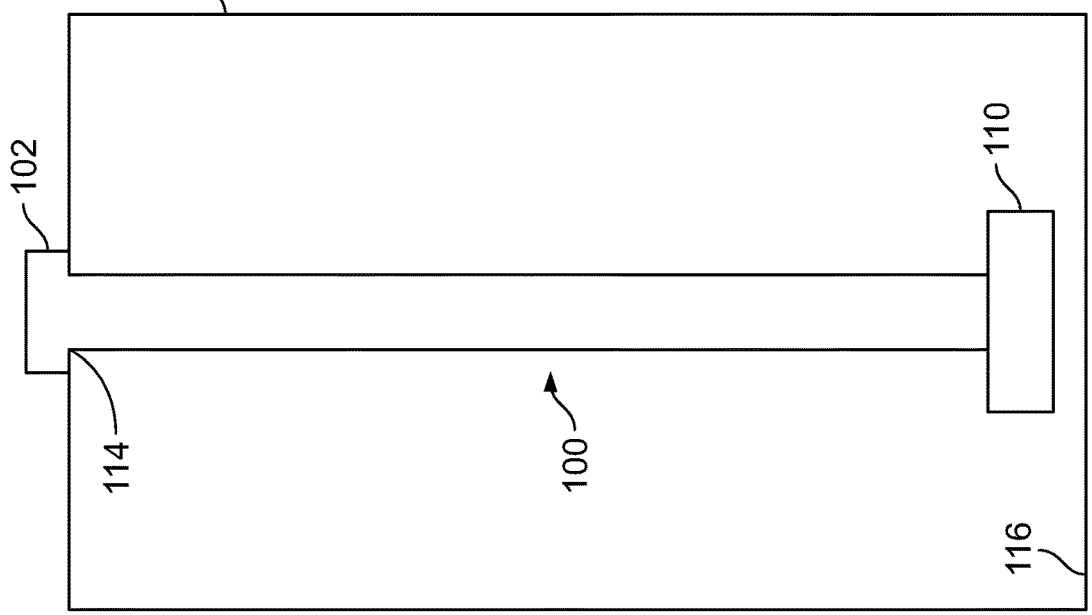
FIG. 2 is a schematic side view of a urea tank with a sensor part mounted therein.

FIG. 2 illustrates schematically the mounting of the urea sensor module 100 inside a urea tank 112. According to the present invention, the sensor part 110 is located away from an orifice 114 which is provided within the urea tank 112 for inserting the urea sensor module 100. Thus, all sensors are arranged closely to a bottom 116 of the urea tank 112, which is advantageous for the accuracy of the temperature sensing as well as the quality measurements.

Figure 3:
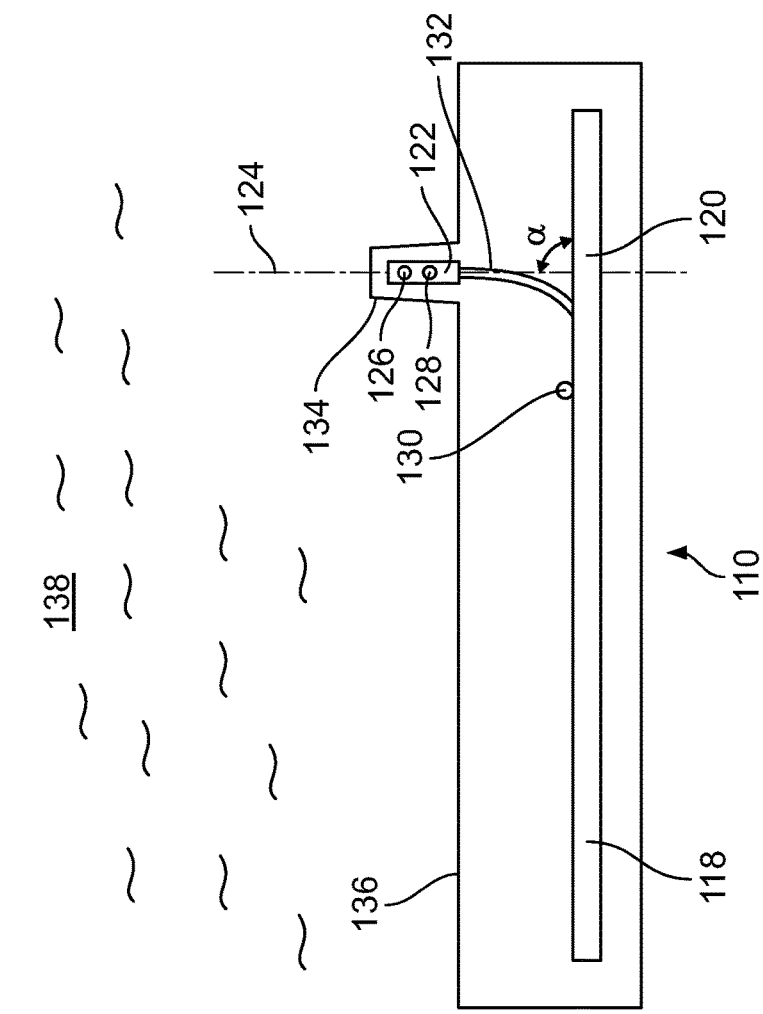
FIG. 3 is a schematic side view of the sensor part.

FIG. 3 shows a schematic sectional view of the sensor part 110 shown in FIG. 2. According to the present invention, the sensor part 110 has a substrate 118 which has a first region 120 and a second region 122. The second region 122 extends in a direction which is essentially at right angles with the plane defined by the first region 120, as indicated by an axis 124. In other embodiments, it is clear for a person skilled in the art that any other angle different from 0° (such as between 80° and 100°) may also advantageously be used. However, also an angle of 0° is possible. The angle can be chosen arbitrarily according to the respective space requirements.

The electrical interconnection between the first region 120 and the second region 122 is established by providing a flexible interconnect region 132, as shown in FIG. 3. In an embodiment, the substrate 118 is formed by a rigid flex substrate, wherein the first region 120 and the second region 122 comprise rigid printed circuit boards, while the interconnect region 132 is formed by a flexible printed circuit board. This construction has the advantage that the substrate 118 may be fabricated two-dimensionally and assembled with electronic components before bending the second region 122 into its final position. The second region 122 can be brought into the third dimension only when mounting the substrate 118 in a protective housing. Consequently, the fabrication can be facilitated significantly.

As is generally known, flexible printed circuit boards are also referred to as flexible printed circuitry (FPC), flex circuits, or flexible PCBs. Flexible printed circuits were originally designed as a replacement for traditional wire harnesses. A flexible circuit in its purest form is a vast array of conductors bonded to a thin dielectric film. However, in connection with the present invention, it is intended that a flexible printed circuit board signifies a bendable support for electrically conductive leads and optionally also for active and passive electronic components, such as resistors, capacitors, inductances, sensors, and more complex monolithic components.

With most rigid flex circuit boards, the circuitry consists of multiple flexible circuit inner layers selectively attached together using an epoxy pre-preg bonding film, similar to a multilayer flexible circuit. However, a multilayer rigid flex circuit incorporates a rigid board externally, internally or both as needed to accomplish the design. Rigid flex circuits combine the best of both rigid boards and flexible circuits integrated together into one circuit. The two-in-one circuit is interconnected for instance through plated through holes, so-called vias. Rigid flex circuits provide higher component density and better quality control. Designs are rigid where extra support is needed and flexible around corners and areas requiring extra space.

Alternatively, the substrate 118 may also be realized as a so-called molded interconnect device (MID) component. MID encompasses three-dimensional circuit carrier which are injection molded from a modified polymeric material. This modification may allow laser activation of circuit tracks on the surface of the circuit carrier the activated areas become metallized in a chemical metallization bath in order to build conductive tracks which are thus extending into the third dimensions. Apart from laser direct structuring techniques (additive as well as subtractive) also a two shot injection molding, hot embossing, and insert molding can be used for fabricating a three dimensional substrate that may be employed for a temperature sensing unit according to the present invention.

In the second region 122, a first temperature sensor 126 and a second temperature sensor 128 are arranged along the axis 124. However, also only one temperature sensor or more than two temperature sensors may be arranged in the second region 122 according to the present invention. According to the present invention, the first and second temperature sensors 126, 128 are for instance formed by negative temperature coefficient (NTC) sensors. These resistances with a negative temperature coefficient are available as integrated surface-mount technology (SMT) components and have the advantage of providing accurate temperature dependent signals, while being robust and long-term stable. However, it is clear that any other suitable temperature sensing element may also be employed, such as a thermocouple or the like.

The first temperature sensor 126 and the second temperature sensor 128 in the second region 122 yield a differential temperature dependent signal. Such a differential measurement eliminates the influence of any common-mode interferences on the measurement results. Moreover, two (or more) temperature sensors can also be provided for redundancy, so that in case one sensor fails still a temperature measurement can be performed.

In an embodiment, the first temperature sensor 126 is arranged in the second region 122 to be distanced away from the first region 120 farther than the second temperature sensor 128 is distanced from the first region 120. Thereby, the two temperature sensors 126, 128 are arranged serially along a longitudinal axis of the second region 122, thus keeping low the space requirements.

As shown in FIG. 3, according to the present invention, the second region 122 carrying the at least one temperature sensor 126, 128 is encased in a separate housing element 134 which protrudes from a main cover 136 that covers the first region 120 with the electronic components arranged thereon. The second region 122 in the separate housing element 134 thereby forms a sort of a "tower" protruding from the main cover 136 of the sensor part 110. As schematically depicted in FIG. 3 (although it has to be noted that the drawing is not to scale), the protective housing element 134 is much thinner than the cover 136 so that a fluid 138 in which the center part 110 is immersed has a much more direct thermal contact to the temperature sensors 126, 128.

Additionally, a third temperature sensor 130 which forms a reference temperature sensor can be provided in the first region 120, as shown in FIG. 3. By analyzing the temperature on the first region 120, which forms a main printed circuit board assembly (PCBA) of the sensor part 110, compared to the temperature in the tower, temperature changes in the liquids 138 can be detected. This can be used to correct the measured temperature inside the tower in order to improve the temperature response of the system. This is especially important during thawing conditions, when the liquid 138 temperature can change rapidly. The reference temperature sensor 130 may also be an NTC temperature sensor. However, it is clear that any other suitable temperature sensing element may also be employed, such as a thermocouple or the like.

The temperature sensing unit may be operable to predict an external temperature by combining a first temperature signal generated by the at least one temperature sensor 126, 128 arranged in the second region 122 with a second temperature signal generated by the at least one third temperature sensor 130 which is arranged in the first region 120. For instance, a suitable model that correlates the external temperature with the temperature differences between the two regions 120, 122 can be used for processing the first and second temperature signals.

As already mentioned above, existing SCR systems use temperature sensors only on the PCBA, so that self-heating of the PCBA affects the temperature measurement and reduces the accuracy of the system. Moreover, the thermal coupling of the conventional temperature sensors to the liquid is also low due to low thermal conductivity of the potting around the PCBA. The solution according to the present invention, however, allows using the optional temperature sensor 130 provided on the PCBA only as a reference and measuring the fluid temperature by at least one temperature sensor 126, 128 arranged inside the protruding housing element 134.

FIG. 4 shows the layout of the substrate 118 according to an exemplary embodiment of the present invention according to this example, the first region 120 is formed by a rigid printed circuit board carrying a plurality of electronic components including a control unit 140. the second region 122 is also formed by a rigid circuit board and carries the first and second temperature sensors 126, 128. In the shown embodiment, the temperature sensors 126, 128 are formed by NTC elements. The first region 120 and the second region 122 are connected to each other by a flexible interconnect region 132. The interconnect region 132 comprises electrically conductive leads for connecting the temperature sensors 126, 128 to the control unit 140.

The reference temperature sensor 130 which is suitable for measuring the temperature on the main PCB is arranged in the first region 120, as shown in FIG. 4. Moreover, the first region 120 which is forming a main PCB, may also be connected via a second flexible interconnect region 142 to at least one further rigid substrate 144. In an embodiment, the complete substrate 118 as shown in FIG. 4 is formed as one integrated rigid flex PCB.

FIG. 5 illustrates in a schematic perspective view how the substrate 118 is arranged inside the protective main cover 136. The protruding housing element 134 extends from the surface of the main cover 136 and contains the second region 122 with the temperature sensors 126, 128. Moreover, the first region 120 of the substrate 118 carries the at least one reference temperature sensor 130 for measuring the temperature close to the electronic control unit 140.

In the following, the assembly of a temperature sensing unit according to the present invention will be explained in detail with reference to FIGS. 3 to 5.

In a first step, a substrate 118 as for instance shown in FIG. 4 which has rigid and flexible region is provided. In the first region 120 electronic components such as an electronic control unit 140 and an optional reference temperature sensor 130 are assembled. In the second region 122 at least one temperature sensor 126, 128 are located. According to the present invention, all electronic components can be mounted in a pick-and-place assembly step and will be electrically connected by a subsequent reflow soldering step. The substrate 118 is flat in an embodiment, as shown in FIG. 4.

In the next step, a cover 136 with a protruding housing element 134 is provided and the second region 122 is slid in a direction along the axis 124 into a recess that is provided inside the protruding housing element 134, as shown in FIG. 5. This is possible because the electric interconnection between the first region 120 and the second region 122 is formed by a flexible interconnect region 132. In a final step, a potting material may be cast around the first region 122 and the flexible interconnect region 132.

This process allows for a secure and stable electric connection between the temperature sensors 126, 128 and an electronic control unit 140, while at the same time the fabrication process is particularly simple and fast. On the other hand, fast response times and an optimal thermal coupling of the temperature sensor 126, 128 to the fluid 138 can be achieved.

In summary, a method of assembling a temperature sensing unit may comprise the following steps: providing a substrate 118 comprising at least one first region 120 and at least one second region 122; mounting at least one temperature sensor 126, 128 in the second region 122 of the substrate 118; wherein said second region 122 extends away from the first region 120. Furthermore, said first region 120 and said second region 122 are electrically and mechanically interconnected by an interconnecting section 132 comprising a flexible printed circuit board, and the method comprises the step of bending the second region 122 into a position in which it extends perpendicular to the first region 120.

Thereby, the substrate 118 may first be fully populated with the electronic components by a standard two dimensional pick-and-place procedure, for instance using SMT (surface mount technology) components which are reflow soldered to the substrate. Only then the substrate 118 is bent so that the second region 120 is arranged perpendicular to the plane defined by the main PCB.

The method may comprise the step of encasing the second region 122 at least partly in a separate temperature sensor housing element 134 which protrudes from a main cover 136 covering the first region 120 of the substrate 118. In an embodiment, the second region 122 is inserted into a recess that is formed inside the temperature sensor housing element 134. The arrangement can be mechanically fixed for instance by filling in some potting material that covers the interconnection 132 between the first and second region 120, 122 of the substrate 118.

In order to allow for a reference measurement close to the main PCB, a third (reference) temperature sensor 130 is assembled in the first region 120 of the substrate 118. This step may be performed essentially simultaneously with mounting at least one temperature sensor 126, 128 in the second region 122.

Finally, a method of assembling a urea sensor module 100 for being installed in a urea tank includes assembling a temperature sensing unit performing the steps according to the method explained above, wherein the urea sensor module is to be mounted at an opening of the urea tank so that a sensor part 110 extends to an inside of the urea tank, and wherein the temperature sensing unit is arranged at the sensor part 110.

Figure 6:
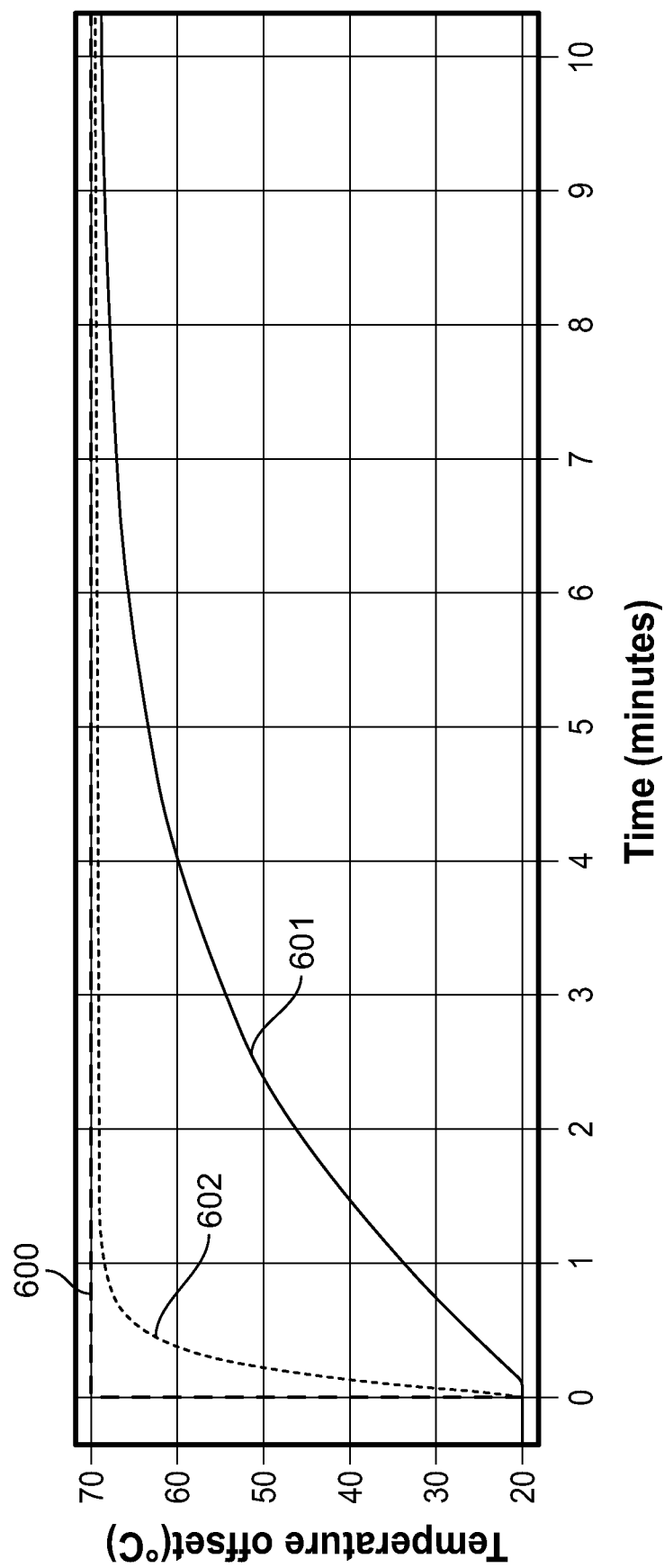
FIG. 6 is a graph of a temperature response of a temperature sensing unit of the sensor part.

FIG. 6 illustrates the temperature response behavior of the temperature sensing unit of the urea sensor module 100 according to the present invention. In particular, curve 600 shows a temperature step of 50° C. in the fluid 138. As shown by curve 601, the temperature sensor 130 arranged in the first region 120 under the main cover 136 requires about 10 minutes to reach the full amplitude of the signal corresponding to the fluid temperature step. In contrast thereto, as indicated by curve 602, the differential signal of the first temperature sensor 126 and the second temperature sensor 128 indicates the full scale of the temperature signal corresponding to a 50° C.-temperature step in the fluid already after about 1.5 minutes.

In summary, the idea of placing the temperature sensors 126, 128 in a "tower", extending away from the rest of the substrate 118, increases the thermal coupling of the sensors 126, 128 to the liquid 138, while reducing the coupling to the PCBA. This has two effects. Firstly, the sensors 126, 128 respond much quicker to temperature changes in the liquid 138 by being positioned in a more direct contact with the liquid 138, and secondly, they are less affected by the self-heating from the PCBA. In addition, the temperature sensors 126, 128 are mounted on a PCB part 122 which is connected to the main PCBA 120 via an integrated flex cable 132. This improvement eliminates the need for manual soldering and greatly simplifies the manufacturing process, thus reducing cost. Furthermore, by having two spatially separate temperature measurements, one from the "tower" and one from the PCBA, the detection of temperature changes in the liquid 138 can be improved and a better accuracy can be achieved.

By being able to provide an accurate monitoring of the urea solution, the urea sensor module 100 according to the present invention has the advantage that in case of freezing, suitable counter measures can be taken, for instance heating the liquid 138 and/or purging the supply line (and also the pump, filter, etc. and all the components located over this line) in order to prevent damage following the formation of ice.

In an embodiment, the sensor part 110 includes at least one of a fluid level sensor, and a fluid quality sensor, which are arranged in the first region 120 of the substrate 118, while the at least one temperature sensor 126, 128 of the temperature sensing unit is arranged in the second region 122 of the substrate 120, extending away from the main PCBA. This arrangement has the advantage that any interference with the temperature monitoring by the components assembled on the main PCB can be kept low.

The present invention is usable for a selective catalytic reduction (SCR) system for purification of harmful NOx components in the exhaust gases of diesel vehicles, the system comprising a urea tank and a urea sensor for installation in the urea tank for measuring one or several properties of the urea solution in the tank and a temperature sensing unit according to the present invention.

What is claimed is:

1. A temperature sensing unit, comprising:
 a temperature sensor; and
 a substrate including a first region and a second region,
  the temperature sensor is arranged in the second region,
  the second region extends away from the first region,
  the first region and the second region are electrically and mechanically interconnected by an interconnect region, the interconnect region is a flexible printed circuit board that is more flexible than the first region and the second region, the second region is at least partly encased in a separate housing element connected to a main cover covering the first region and protruding from the main cover.

2. The temperature sensing unit of claim 1, wherein the substrate is a rigid flex circuit board.

3. The temperature sensing unit of claim 2, wherein the second region is arranged on a rigid section of the rigid flex circuit board.

4. The temperature sensing unit of claim 1, wherein the temperature sensor includes a first temperature sensor and a second temperature sensor disposed in the second region and providing a differential temperature dependent signal.

5. The temperature sensing unit of claim 4, wherein the first temperature sensor is arranged in the second region distanced from the first region further than the second temperature sensor is distanced from the first region.

6. The temperature sensing unit of claim 4, further comprising a third temperature sensor arranged in the first region.

7. The temperature sensing unit of claim 6, wherein the temperature sensing unit predicts an external temperature by combining a first temperature signal generated by at least one of the first temperature sensor and the second temperature sensor with a second temperature signal generated by the third temperature sensor.

8. A urea sensor module for being installed in a urea tank, comprising:
 a temperature sensing unit including a temperature sensor and a substrate including a first region and a second region, the temperature sensor is arranged in the second region, the second region extends away from the first region, the first region and the second region are electrically and mechanically interconnected by an interconnect region, the interconnect region is a flexible printed circuit board that is more flexible than the first region and the second region.

9. The urea sensor module of claim 8, wherein the urea sensor module is mounted at an opening of the urea tank.

10. The urea sensor module of claim 9, wherein a sensor part of the urea sensor module extends to an inside of the urea tank, the temperature sensing unit is arranged at the sensor part.

11. The urea sensor module of claim 10, wherein the sensor part has a fluid level sensor and a fluid quality sensor arranged in the first region of the substrate.

* * * * *